United States Patent
Pfuetzner et al.

(10) Patent No.: US 8,778,795 B2
(45) Date of Patent: Jul. 15, 2014

(54) METALLIZATION SYSTEMS OF SEMICONDUCTOR DEVICES COMPRISING A COPPER/SILICON COMPOUND AS A BARRIER MATERIAL

(75) Inventors: Ronny Pfuetzner, Dresden (DE); Jens Heinrich, Wachau (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/192,164

(22) Filed: Jul. 27, 2011

(65) Prior Publication Data

US 2012/0153480 A1 Jun. 21, 2012

(30) Foreign Application Priority Data

Dec. 16, 2010 (DE) .......................... 10 2010 063 294

(51) Int. Cl.
*H01L 21/4763* (2006.01)

(52) U.S. Cl.
USPC ............... 438/630; 257/E21.203; 257/751; 257/754; 438/651; 438/655

(58) Field of Classification Search
CPC ............................................. H01L 21/28518
USPC .......... 257/E21.584, E23.161, 750–754, 758, 257/762, 774, E21.2, E21.203, 486; 438/627, 687, 630, 643, 649, 653, 647, 438/651, 655, 657
See application file for complete search history.

(56) References Cited

U.S. PATENT DOCUMENTS

| | | | | |
|---|---|---|---|---|
| 6,046,108 A | * | 4/2000 | Liu et al. | 438/687 |
| 6,147,402 A | * | 11/2000 | Joshi et al. | 257/751 |
| 6,214,731 B1 | * | 4/2001 | Nogami et al. | 438/687 |
| 6,518,177 B1 | * | 2/2003 | Kawanoue et al. | 438/653 |
| 6,656,840 B2 | * | 12/2003 | Rajagopalan et al. | 438/687 |
| 6,727,590 B2 | * | 4/2004 | Izumitani et al. | 257/758 |
| 6,777,811 B2 | * | 8/2004 | Harada | 257/762 |
| 6,949,461 B2 | * | 9/2005 | Malhotra et al. | 438/643 |
| 7,098,537 B2 | * | 8/2006 | Cabral et al. | 257/751 |
| 7,102,235 B2 | * | 9/2006 | Raaijmakers et al. | 257/758 |
| 7,176,571 B2 | * | 2/2007 | Cheng et al. | 257/750 |
| 7,215,006 B2 | * | 5/2007 | Yang et al. | 257/632 |
| 7,241,696 B2 | * | 7/2007 | Clevenger et al. | 438/722 |
| 7,390,739 B2 | * | 6/2008 | Lazovsky et al. | 438/653 |
| 7,413,985 B2 | | 8/2008 | Streck et al. | 438/687 |
| 7,524,755 B2 | | 4/2009 | Widodo et al. | 438/627 |
| 7,557,447 B2 | * | 7/2009 | Usami et al. | 257/758 |
| 7,569,467 B2 | * | 8/2009 | Katou | 438/592 |
| 7,576,006 B1 | * | 8/2009 | Yu et al. | 438/687 |

(Continued)

FOREIGN PATENT DOCUMENTS

DE 102006056624 A1 6/2008 ............ H01L 21/768

OTHER PUBLICATIONS

Translation of Official Communication from German Patent Office for German Patent Application No. 10 2010 063 294.5 dated Jun. 21, 2011.

*Primary Examiner* — Chris Chu

(74) *Attorney, Agent, or Firm* — Amerson Law Firm, PLLC

(57) ABSTRACT

In sophisticated metallization systems of semiconductor devices, a sensitive core metal, such as copper, may be efficiently confined by a conductive barrier material comprising a copper/silicon compound, such as a copper silicide, which may provide superior electromigration behavior and higher electrical conductivity compared to conventionally used tantalum/tantalum nitride barrier systems.

18 Claims, 4 Drawing Sheets

(56) References Cited

U.S. PATENT DOCUMENTS

| | | |
|---|---|---|
| 7,655,555 B2 * | 2/2010 | Faust et al. .................... 438/627 |
| 7,732,314 B1 * | 6/2010 | Danek et al. .................. 438/584 |
| 7,737,027 B2 * | 6/2010 | Tsukamoto et al. .......... 438/637 |
| 2003/0214043 A1 | 11/2003 | Saitoh et al. .................. 257/758 |
| 2007/0273042 A1 * | 11/2007 | Kuhn et al. .................... 257/762 |
| 2010/0167526 A1 | 7/2010 | Fu et al. ........................ 438/643 |

* cited by examiner

METALLIZATION SYSTEMS OF SEMICONDUCTOR DEVICES COMPRISING A COPPER/SILICON COMPOUND AS A BARRIER MATERIAL

BACKGROUND OF THE INVENTION

1. Field of the Invention

Generally, the present disclosure relates to microstructures, such as advanced integrated circuits, and, more particularly, to metallization systems comprising sophisticated dielectric and conductive materials.

2. Description of the Related Art

In the field of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep submicron range, thereby increasing performance of these circuits in terms of speed and/or power consumption and/or diversity of functions. As the size of individual circuit elements is reduced with every new circuit generation, thereby improving, for example, the switching speed of the transistor elements, the available floor space for interconnect structures electrically connecting the individual circuit elements is also decreased. Consequently, the dimensions of these interconnect structures are also reduced to compensate for a reduced amount of available floor space and for an increased number of circuit elements provided per unit die area as typically the number of interconnections required increases more rapidly than the number of circuit elements. Thus, usually a plurality of stacked wiring layers, also referred to as metallization layers, is provided, wherein individual metal lines of one metallization layer are connected to individual metal lines of an overlying or underlying metallization layer by so-called vias. The vertical connections and the metal lines may also commonly be referred to as interconnect structures. Despite the provision of a plurality of metallization layers, reduced dimensions of the interconnect structures are necessary to comply with the enormous complexity of, for instance, modern CPUs, memory chips, ASICs (application specific ICs) and the like.

Advanced integrated circuits, including transistor elements having a critical dimension of 0.05 µm and even less, may, therefore, typically be operated at significantly increased current densities of up to several kA per $cm^2$ in the individual interconnect structures, despite the provision of a relatively large number of metallization layers, owing to the significant number of circuit elements per unit area. Consequently, well-established materials, such as aluminum, are being replaced by copper and copper alloys, i.e., materials with significantly lower electrical resistivity and improved resistance to electromigration even at considerably higher current densities compared to aluminum. The introduction of copper into the fabrication of microstructures and integrated circuits comes along with a plurality of severe problems residing in copper's characteristic to readily diffuse in silicon dioxide and a plurality of low-k dielectric materials, which are typically used in combination with copper in order to reduce the parasitic capacitance within complex metallization layers. In order to provide the necessary adhesion and to avoid the undesired diffusion of copper atoms into sensitive device regions, it is, therefore, usually necessary to provide a barrier layer between the copper and the low-k dielectric material in which the copper-based interconnect structures are embedded. Although silicon nitride is a dielectric material that effectively prevents the diffusion of copper atoms, selecting silicon nitride as an interlayer dielectric material is less then desirable, since silicon nitride exhibits a moderately high permittivity, thereby increasing the parasitic capacitance of neighboring copper lines, which may result in non-tolerable signal propagation delays. Hence, a thin conductive barrier layer that also imparts the required mechanical stability to the copper is usually formed so as to separate the bulk copper from the surrounding dielectric material, thereby reducing copper diffusion into the dielectric materials and also reducing the diffusion of unwanted species, such as oxygen, fluorine and the like, into the copper. Furthermore, the conductive barrier layers may also form highly stable interfaces with the copper, thereby reducing the probability for significant material transport at the interface, which is typically a critical region in view of increased diffusion paths that may facilitate current-induced material diffusion. Currently, tantalum, titanium, tungsten and their compounds, with nitrogen and silicon and the like, are preferred candidates for a conductive barrier layer, wherein the barrier layer may comprise two or more sub-layers of different composition so as to meet the requirements in terms of diffusion suppressing and adhesion properties.

Another characteristic of copper significantly distinguishing it from aluminum is the fact that copper may not be readily deposited in larger amounts by chemical and physical vapor deposition techniques, thereby requiring a process strategy that is commonly referred to as the damascene or inlaid technique. In the damascene process, first a dielectric layer is formed which is then patterned to include trenches and/or via openings which are subsequently filled with copper, wherein, as previously noted, prior to filling in the copper, a conductive barrier layer is formed on sidewalls of the trenches and vias. The deposition of the bulk copper material into the trenches and via openings is usually accomplished by wet chemical deposition processes, such as electroplating and electroless plating, thereby requiring the reliable filling of vias with an aspect ratio of 5 and more with a diameter of 0.3 µm or even less in combination with trenches having a width ranging from 0.1 µm to several µm. Electrochemical deposition processes for copper are well established in the field of electronic circuit board fabrication. However, for the dimensions of the metal regions in semiconductor devices, the void-free filling of high aspect ratio vias is an extremely complex and challenging task, wherein the characteristics of the finally obtained copper-based interconnect structure significantly depend on process parameters, materials and geometry of the structure of interest. Since the geometry of interconnect structures is substantially determined by the design requirements and may, therefore, not be significantly altered for a given microstructure, it is of great importance to estimate and control the impact of materials, such as conductive and nonconductive barrier layers, the copper microstructure and the like, and their mutual interaction on the characteristics of the interconnect structure as a whole so as to insure both high yield and the required product reliability. In particular, it is important to identify, monitor and reduce degradation and failure mechanisms in metallization systems for various configurations so as to maintain device reliability for every new device generation or technology node.

Accordingly, a great deal of effort is being made in investigating the degradation of copper interconnects, especially in combination with low-k dielectric materials or ultra low-k (ULK) materials having a relative permittivity of 3.0 or even less, in order to find new materials and process strategies for forming copper-based lines and vias with a low overall permittivity and superior reliability.

One failure mechanism which is believed to significantly contribute to a premature device failure is the electromigration-induced material transport particularly along an interface formed between the copper and any barrier materials and a dielectric cap layer, which may be provided on the sidewalls and at the top of the core metal.

Consequently, the conductive barrier material may not only have to provide superior adhesion and copper diffusion blocking capabilities, but may also have to provide strong interfaces with the copper core metal in order to reduce the current-induced copper diffusion along the interface areas and also to substantially avoid material diffusion through any barrier layers. Upon further device scaling, in particular the characteristics of the conductive barrier materials may gain in importance since typically the thickness of the barrier materials may not scale in the same manner as the overall lateral dimensions of the interconnect structures have to be reduced. That is, in view of a reliable coverage of any inner surface areas of the interconnect structures, a certain minimum thickness may have to be preserved in order to reliably cover any critical sidewall areas, such as lower portions of via openings and the like. Consequently, the layer thickness may be significantly greater in less critical areas, thereby reducing the effective cross-sectional size of the resulting interconnect features. Hence, upon further scaling of the interconnect structure, the specific resistivity of these structures may increase due to a relative increase of the conductive barrier material with respect to the actual highly conductive core metal. For this reason, great efforts are being made in reducing the thickness of the conductive barrier layer systems while not unduly affecting the overall electromigration performance. It appears, however, that required electromigration behavior in combination with a desired low resistivity of the resulting interconnect structures may be difficult to achieve on the basis of well-established barrier layer systems comprising tantalum and tantalum nitride.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Basically, the present disclosure provides semiconductor devices and manufacturing techniques in which highly conductive fill metals, such as copper, copper alloys, silver and the like, may be reliably confined on the basis of a conductive barrier material which may provide superior electromigration behavior and reduced electrical resistivity compared to conventional tantalum-based barrier layer systems. To this end, a copper/silicon-containing material may be provided as an interface between dielectric material and the highly conductive core metal, thereby taking advantage of the superior material characteristics of a copper/silicon compound. Hereinafter, a silicon and copper-containing conductive material with a copper concentration of 5 atomic percent or more and a silicon content of 5 atomic percent or more may be referred to as copper silicide, irrespective of the actual stoichiometric composition of the silicon/copper compound. Furthermore, the silicon/copper compound may also include other atomic species, which in some illustrative embodiments may be present with a concentration of 5 atomic percent or less, wherein any such material composition may also be referred to as a copper silicide. It is well known that a copper silicide material may have superior electromigration performance, for instance compared to tantalum and tantalum nitride, thereby providing superior stability during a typical stress situation, as may occur during the operation of complex semiconductor devices. Hence, the current-induced or stress-induced copper diffusion may be efficiently blocked by the copper silicide material, even if provided with a reduced thickness compared to conventional conductive barrier material systems. Furthermore, the electrical conductivity is higher compared to the conventionally used tantalum/tantalum nitride barrier system, thereby enhancing electrical performance and in particular reducing the resistance between vias and metal lines, which may conventionally suffer from the moderately high resistivity of the tantalum/tantalum nitride barrier material. The silicon/copper compound may be formed on the basis of well-established process strategies, such as a silicidation on the basis of a silicon-containing process ambient, which may be provided in the form of plasma ambient and the like. In other illustrative embodiments disclosed herein, the silicon species may be provided by depositing a dedicated layer, which may be provided prior to or after depositing a copper-containing material layer in order to initiate a silicidation process. Consequently, the silicon/copper compound may be provided with high controllability, thereby contributing to enhanced reliability and superior electrical performance.

One illustrative method disclosed herein relates to forming a metallization system of a semiconductor device. The method comprises forming an opening in a dielectric layer of a metallization layer of the metallization system, wherein the opening has inner surface areas. The method further comprises forming a conductive barrier layer on the inner surface areas, wherein the conductive barrier layer comprises a copper/silicon compound. Moreover, the method comprises forming a copper-containing metal on the conductive barrier layer.

A further illustrative method disclosed herein comprises forming a copper/silicide barrier layer on inner surface areas of an opening that is formed in a dielectric material of a metallization layer of a metallization system of a semiconductor device. Moreover, the method comprises forming a copper-containing metal on the copper silicide barrier layer so as to fill the opening.

One illustrative semiconductor device disclosed herein comprises a metallization layer formed above a substrate and comprising a dielectric material and a copper-containing metal region. The semiconductor device further comprises a conductive barrier layer that forms an interface between sidewalls of the copper-containing metal region and the dielectric material, wherein the conductive barrier layer comprises a copper-silicon compound. Furthermore, the semiconductor device comprises a cap layer that is formed above the dielectric material and the copper-containing metal region.

BRIEF DESCRIPTION OF THE DRAWINGS

The disclosure may be understood by reference to the following description taken in conjunction with the accompanying drawings, in which like reference numerals identify like elements, and in which.

Figure 1A:
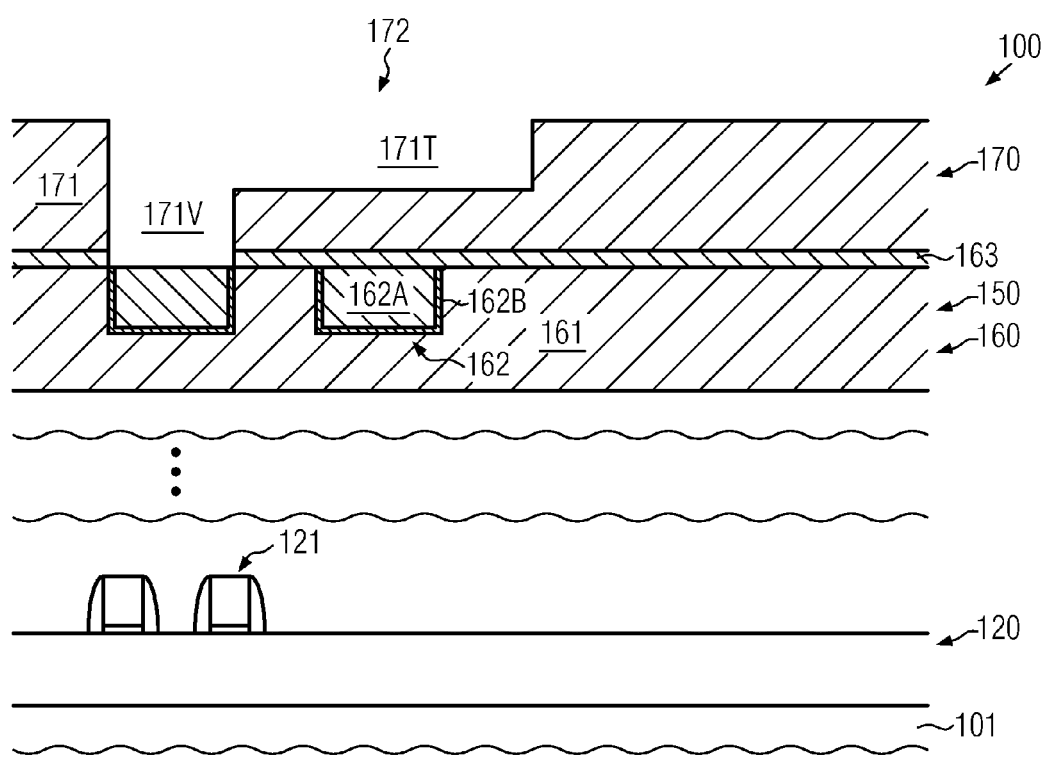
FIG. 1a schematically illustrates a cross-sectional view of a semiconductor device with a metallization system receiving a superior barrier material layer comprising a copper-silicon compound in combination with a highly conductive core metal, such as copper, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure addresses the problem of reduced reliability and electrical performance of complex metallization systems caused by barrier material systems, such as tantalum, tantalum nitride barrier systems. To this end, in some illustrative embodiments disclosed herein, the usage of conventional tantalum-based barrier systems may be avoided by providing a conductive barrier material in the form of a copper/silicon compound, which may also be referred to as a copper silicide, which may per se provide superior electromigration performance compared to tantalum and tantalum nitride, while at the same time the electrical conductivity may be higher compared to conventional barrier systems. In this manner, for a given thickness and for given lateral dimensions of complex interconnect structures, a reduced overall resistance may be obtained, in particular at an interface between a via and a lower-lying metal line, while at the same time the copper silicide may provide superior electromigration characteristics, i.e., the current-induced metal diffusion along and through inner surface areas of the interconnect structure may be reduced compared to conventional barrier systems.

In some illustrative embodiments disclosed herein, the copper/silicon compound may be formed by providing a copper layer with a desired thickness, for instance on the basis of sputter deposition, electrochemical deposition and the like, which may subsequently be converted into a copper silicide by exposing the copper layer to a silicon-containing process ambient, for instance established on the basis of a plasma ambient including precursor gases, such as silane and any related gases, while in other cases a thermally activated gaseous ambient may be established, for instance on the basis of HMDS (hexamethyldisilazan), or derivatives thereof, which may represent well-established chemicals, for instance for treating sophisticated low-k dielectric materials in order to reduce etch-related damage in any such materials. In other illustrative embodiments, the silicon-containing process ambient may be established by forming a specific silicon-containing material layer on a copper layer and initiating a corresponding copper silicon interdiffusion in order to form the desired copper/silicon compound. For example, triazol or any derivatives thereof are well established chemicals for treating copper surfaces and may adhere to any exposed copper surface areas so as to form well-defined surface layers thereon. Moreover, these chemicals may also be prepared so as to include silicon or any other functional groups, which may thus adhere to the copper surface in a well-controllable manner. In a next step, the silicon species may be released, for instance by decomposing the carrier material, which may be accomplished by using elevated temperatures, radiation, such as UV radiation and the like. Consequently, in the subsequent silicon diffusion, a well-controlled amount of silicon species may be incorporated into the copper layer in order to form copper silicide in a highly controlled manner.

In still other illustrative embodiments, the copper/silicon compound may be formed by applying a silicon-containing material layer, such as a silicon layer, and thereafter a copper-containing layer may be formed on the silicon-containing layer in order to initiate a silicon/copper interdiffusion, thereby also forming the desired copper silicide barrier material. Thereafter, the actual fill or core metal, such as copper, may be deposited on the basis of any appropriate deposition techniques, such as electrochemical deposition techniques, wherein the copper silicide material may be used as a catalyst layer or seed layer. In other cases, if desired, a dedicated seed layer may be formed on the copper silicide material in order to further enhance the subsequent deposition of the actual fill metal.

FIG. 1a schematically illustrates a cross-sectional view of a semiconductor device 100 in an advanced manufacturing stage in which a metallization system 150 may be formed above a device level 120 of the semiconductor device 100. The device level 120 may be understood as comprising at least one semiconductor layer, in and above which corresponding semiconductor-based circuit elements 121 are formed, such as transistors, capacitors and the like, as required according to specific circuit assembly of the device 100. Moreover, an appropriate substrate 101, such as a semiconductor substrate in the form of a silicon material and the like, may be provided according to the overall device and process requirements. As discussed above, the metallization system 150 may comprise a plurality of metallization layers, depending on the overall complexity of the device 100. For convenience, a metallization layer 160 is illustrated in FIG. 1a, followed by a further metallization layer 170, in which appropriate interconnect structures are still to be formed. The metallization layer 160 may comprise an appropriate dielectric material 161, which may include low-k dielectric materials, ULK dielectric materials and the like, possibly in combination with conventional dielectric materials, depending on the overall complexity of the metallization system 150. It should be appreciated that, in sophisticated applications and in particular in low power applications, typically a low-k dielectric material may be implemented in the dielectric layer 161. Moreover, a plurality of metal regions 162, which may also be referred to as metal lines or interconnect structures, may be provided so as to be embedded in the dielectric material 161. Furthermore, a cap or etch stop layer 163 may be formed above the dielectric material 161 and the metal regions 162. In some illustrative embodiments, the layer 163 may be directly formed on the metal regions 162, thereby acting as a dielectric barrier material, while in other cases a dedicated conductive barrier material may be formed as a top portion (not shown) of the metal regions 162. For example, the layer 163 may be comprised of silicon dioxide, nitrogen-containing silicon carbide, silicon nitride and the like.

It should be appreciated that the metal regions 162 may comprise highly conductive core metal 162A, such as a copper material and the like, which may be confined by a conductive barrier layer 162B, which, in some illustrative embodiments, may be comprised of a copper/silicon compound in order to provide superior electromigration and electrical performance, as is already discussed above.

The metallization layer 170 in this manufacturing stage may comprise a dielectric material 171, which may also comprise a low-k dielectric material or a ULK material in sophisticated applications, which may be formed on or above the layer 163. Moreover, an opening of an interconnect structure 172 may be provided in the dielectric material 171. For example, a trench 171T in combination with a via opening 171V may be provided so as to connect to one of the metal regions 162. It should be appreciated, however, that the openings 171T, 171V may have any appropriate configuration as required by the overall layout of the metallization layer 170.

The semiconductor device 100 as illustrated in FIG. 1a may be formed on the basis of the following process strategy. The circuit elements 121 in the device level 120 may be formed by using any appropriate process techniques, including sophisticated lithography processes, deposition processes, etch techniques, planarization processes, implantation sequences, anneal processes and the like. For example, the circuit elements 121 may be formed, according to some illustrative embodiments, on the basis of critical dimensions of 50 nm and less. For example, at least some of the circuit elements 121 may be provided in the form of field effect transistors having a critical dimension of 50 nm and less. Thereafter, a contact structure (not shown) may be provided so as to act as an interface between the device level 120 and the metallization system 150. To this end, any appropriate contact technology may be applied. Next, the one or more metallization layers of the system 150 may be formed. For example, the metallization layer 150 may be formed in accordance with process techniques, as will be described in more detail with reference to the metallization layer 170. Thus, any detailed description of the respective process steps may be omitted here. Hence, after depositing the cap or etch stop layer 163, one or more appropriate materials for the dielectric layer 171 may be formed, for instance by chemical vapor deposition (CVD) techniques, spin-on techniques and the like, depending on the type of material to be used. Moreover, if required, the dielectric constant may be adjusted by applying additional treatments, for instance by producing or increasing the degree of porosity in a dielectric base material and the like. Thereafter, complex patterning strategies may be applied, including lithography processes and etch strategies based on hard mask regimes and the like, in order to form the openings 171T, 171V. In other cases, the openings 171T, 171V may be formed separately, for instance by providing a portion of the dielectric material 171 and patterning the same, followed by a subsequent deposition of respective conductive materials, as will be explained later on in more detail. In the example shown, the openings 171T, 171V may be subjected to a common process sequence for providing an appropriate fill metal in combination with a silicon and copper-based barrier material.

Figure 1B:
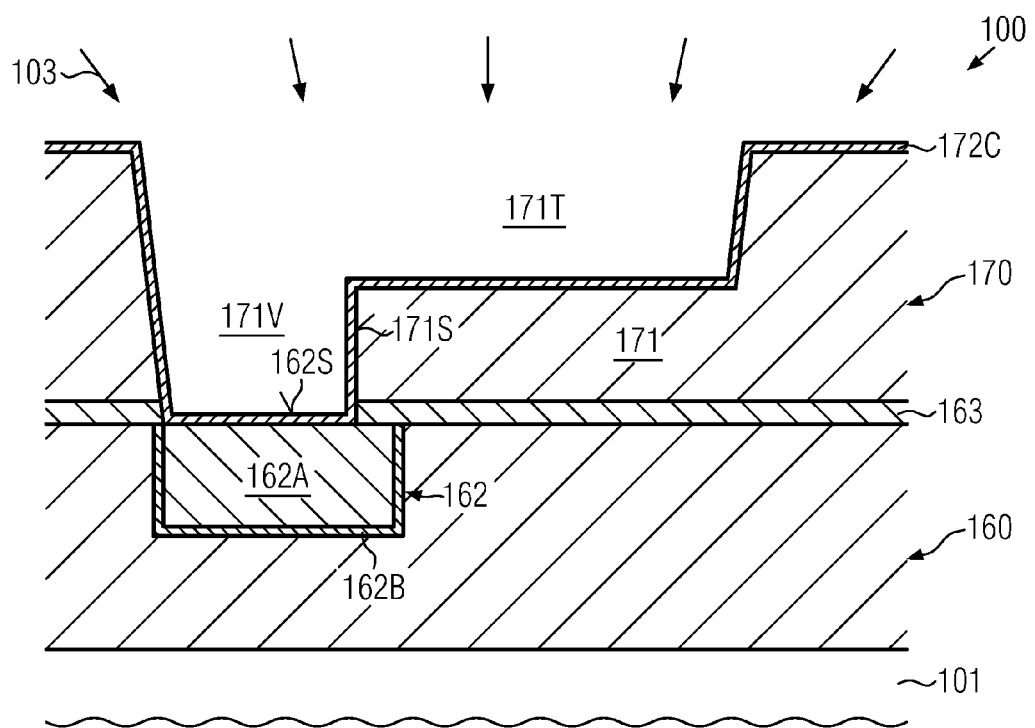
FIGS. 1b-1c schematically illustrate a portion of the metallization system according to illustrative embodiments in which the silicon/copper compound material may be formed by depositing a copper material and exposing the material to a silicon-containing process ambient in order to initiate a silicidation reaction.

FIG. 1b schematically illustrates the semiconductor device 100 in a further advanced manufacturing stage, wherein, for convenience, portions of the metallization layers 170, 160 are illustrated only. As shown, a deposition process 103 may be performed according to illustrative embodiments in order to form a copper-containing material layer 172C on inner sidewalls 171S of the openings 171T, 171V. It should be appreciated, however, that the material layer 172C may also be formed at any other exposed surface areas of the dielectric material 171. Moreover, the layer 172C may be formed on exposed surface areas 162S of the metal region 162 of the metallization layer 160. In some illustrative embodiments, the layer 172C may be provided in the form of a substantially pure copper material, which may be deposited by using sputter deposition techniques and the like. In other cases, the layer 172C may have incorporated therein an additional species, such as an alloy forming species in the form of aluminum and the like, if this is considered appropriate for the silicon/copper compound on the basis of the layer 172C. A corresponding species may be incorporated during the deposition process 103 or may be incorporated, if required, during a separate process step, for instance by applying the plasma ambient and the like.

It should be appreciated that, prior to performing the deposition process 103, additional surface treatments may be performed in order to enhance the surface of the material 171, which may have been damaged during the patterning of the openings 171T, 171V, in particular when the material 171 may comprise a ULK material. To this end, well-established repair strategies may be applied, for instance by exposing the material 171 to a silicon-containing process ambient and the like.

Figure 1C:
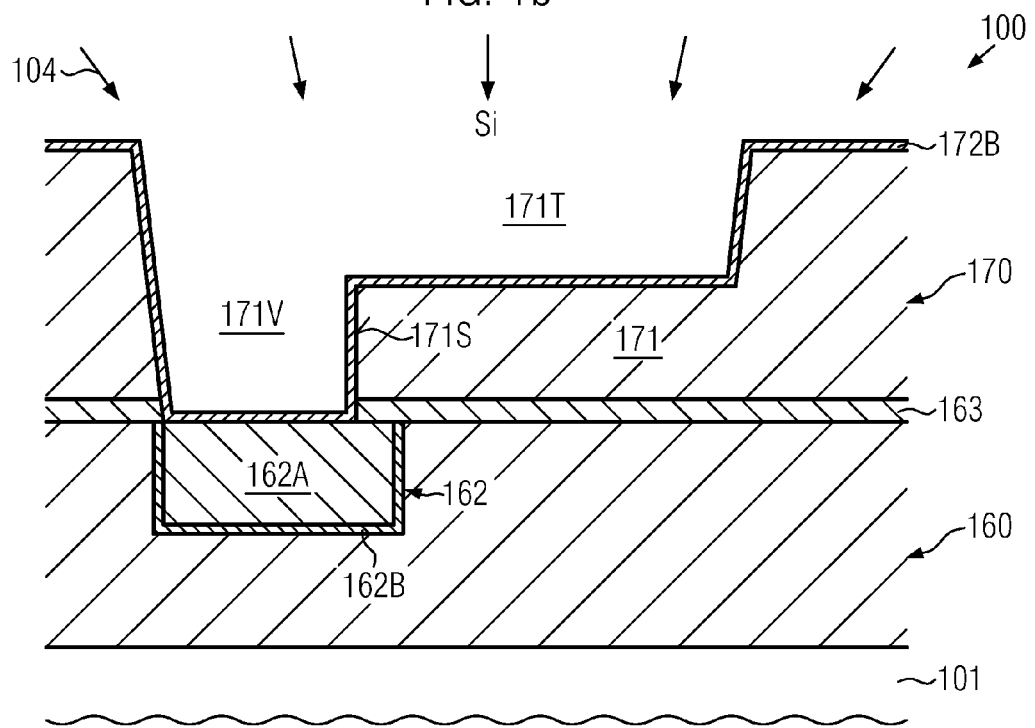

FIG. 1c schematically illustrates the device 100 in a further advanced manufacturing stage in which the device 100 comprising the copper-containing material layer 172B may be exposed to a silicon-containing process ambient 104, which may be established, in some illustrative embodiments, on the basis of a plasma atmosphere including an appropriate silicon-containing gas, such as silane or any similar silicon-containing gas component. Consequently, during the exposure to the ambient 104, silicon species may be incorporated into the previously deposited layer 172C (FIG. 1b), thereby increasingly converting the base material of this layer into a copper-silicon compound, thereby forming a copper silicide. Consequently, after completing the exposure to the ambient 104, a copper-silicon compound barrier layer 172B may be formed on any exposed surface areas and, in particular, on the surface areas 171S of the openings 171T, 171V. In some illustrative embodiments, the barrier layer 172B may thus be comprised of a compound having the chemical formula $Cu_x$-$Si_y$, with x=0.05 . . . 0.95 and with y=0.95 . . . 0.05. It should be appreciated, however, that additional atomic species may be incorporated in the layer 172B due to any imperfections of the process 104, the previously deposited layer 172C (FIG. 1b) and the like. In this case, any unwanted atomic species may be present with a fraction of 5 atomic percent and less. In other illustrative embodiments, as discussed above, a further atomic species, such as aluminum and the like, may be provided with a percentage of 5 atomic percent and higher, wherein, however, copper and silicon may still represent the dominant species in the barrier layer 172B.

Figure 1D:
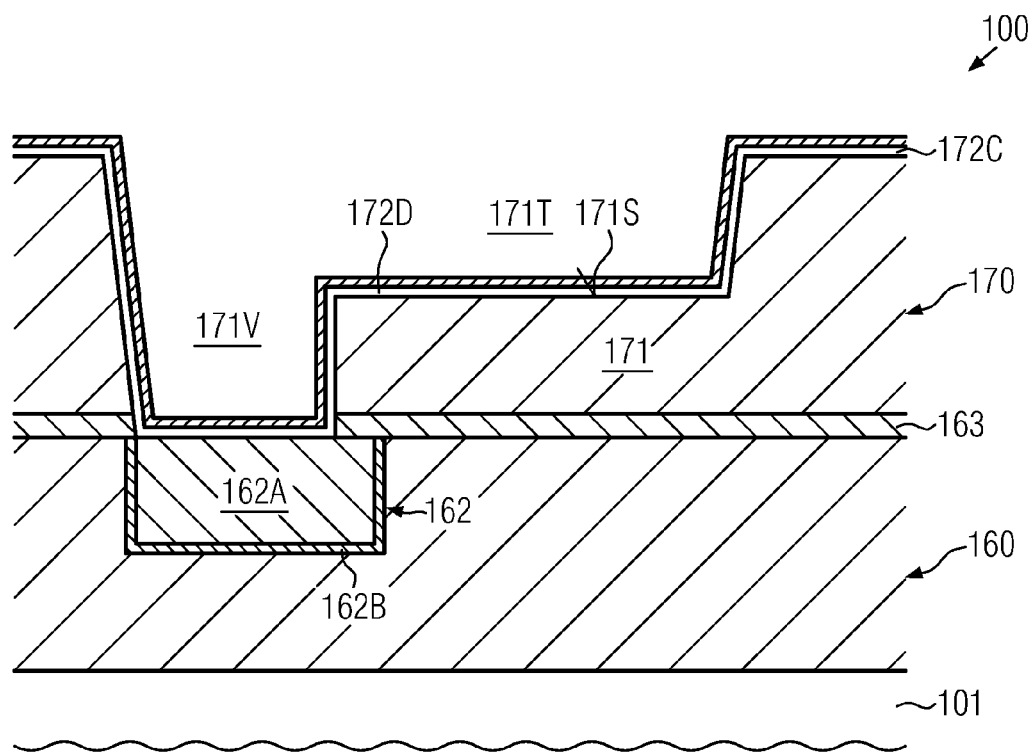
FIGS. 1d-1e schematically illustrate the semiconductor device according to further illustrative embodiments in which a silicon-containing material layer may be deposited, followed by a copper layer in order to initiate a silicidation process to form the copper/silicon-containing barrier layer.

FIG. 1d schematically illustrates the semiconductor device 100 according to further illustrative embodiments. As illustrated, a silicon-containing material layer 172D, such as an amorphous silicon layer, may be formed on the exposed inner surface areas 171S and also on the metal region 162, which may be accomplished by applying any appropriate deposition technique. Furthermore, the copper-containing layer 172C may be formed on the layer 172D, which may be accomplished by sputter deposition techniques and the like, as is also previously explained. It should be appreciated that, in some illustrative embodiments, the layer 172D may be formed during and after a process sequence for enhancing the overall surface conditions of the dielectric material 171, for instance, on the basis of repair chemicals including HMDS and the like. In this manner, the resulting surface may be hardened, thereby avoiding undue copper penetration during the deposition of the layer 172C.

Figure 1E:
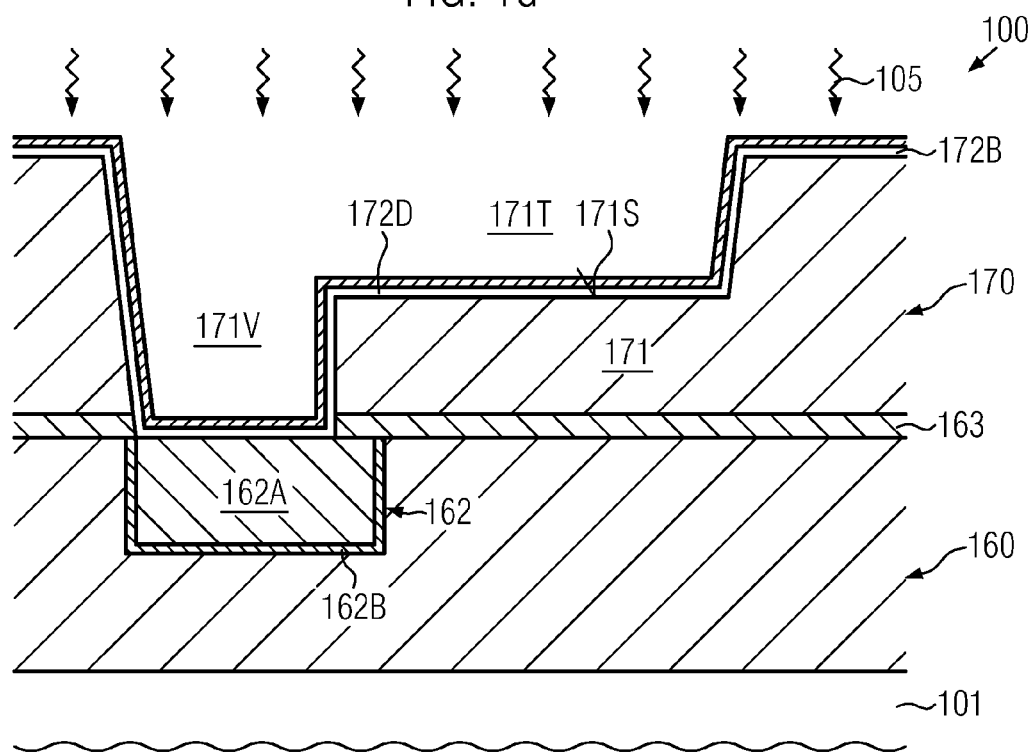

FIG. 1e schematically illustrates the semiconductor device 100 in a further advanced manufacturing stage in which a treatment 105 may be applied so as to initiate the interdiffusion of silicon and copper species of the previously deposited layers in order to increasingly form the desired copper/silicon compound barrier layer 172B. For example, the process atmosphere 105 may be established on the basis of elevated temperatures in a range of 100-300° C. and higher, while in other cases a plasma ambient may be established so as to initiate desired diffusion activity. In some cases, the process 105 may be applied in the presence of a silicon-containing precursor gas, thereby providing superior efficiency in forming the copper/silicon barrier layer 172B.

Figure 1F:
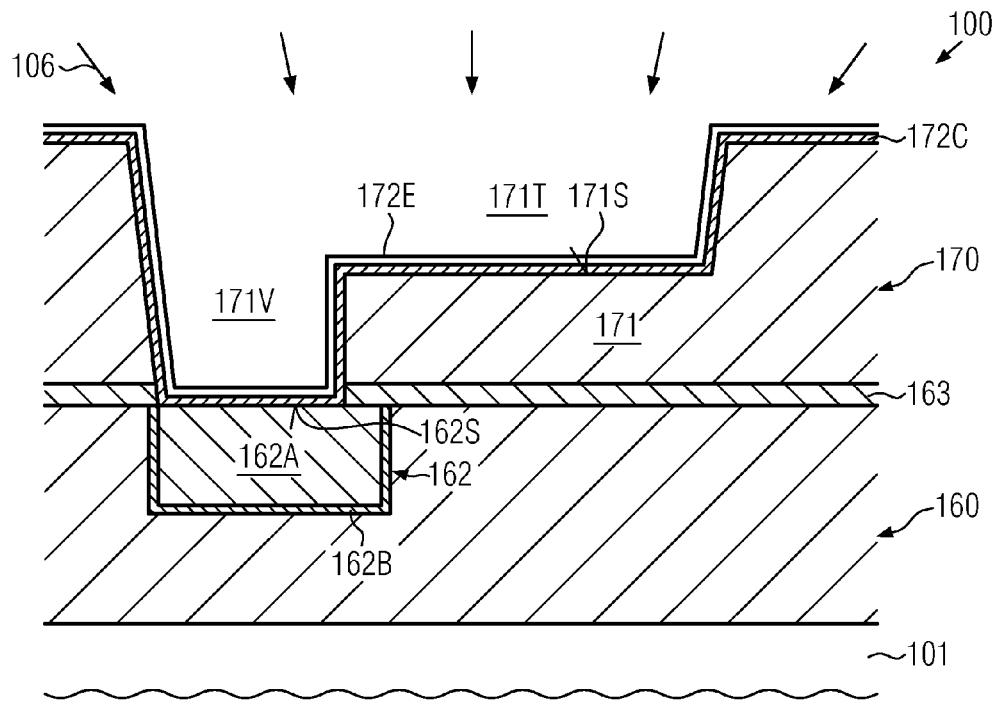
FIG. 1f schematically illustrates the semiconductor device according to still further illustrative embodiments in which a dedicated carrier material including a silicon species may be formed on a copper layer so as to initiate a silicon and copper interdiffusion in order to form the copper silicide barrier material.

FIG. 1f schematically illustrates the semiconductor device 100 according to further illustrative embodiments. As shown, the copper-containing material layer 172C may be formed on the inner sidewall surface areas 171S by any appropriate deposition technique, as is also discussed above. Thereafter, a specific silicon-containing material layer 172E may be formed in a highly controllable manner, which, in some illustrative embodiments, may be accomplished by using an appropriate carrier material, such as triazol or benzene triazol, which may have incorporated therein a silicon species. It is well known that triazol and derivatives thereof may preferably adhere to a copper surface and may thus form a well-defined surface layer in a reliable manner. Consequently, after the deposition of the carrier layer including the silicon species, an appropriate treatment 106 may be applied so as to release the silicon species and to initiate a silicon diffusion into the underlying copper-containing material layer 172C. To this end, a decomposition of the carrier material may be initiated, for instance by elevated temperatures, such as several hundred degrees Celsius, by UV radiation and the like, so that remaining silicon species may be incorporated into the layer 172C. Since the layer 172E may be provided with a well-defined layer thickness, also a well-defined amount of silicon may be incorporated into the layer 172C. If desired, the deposition of the material layer 172E may be repeated in order to further incorporate the silicon species in a highly controllable manner. In this manner, reliable formation of a copper/silicon compound may be accomplished at any device area, for instance within the via opening 171V and in particular at the exposed surface 162S of the metal region 162.

Figure 1G:
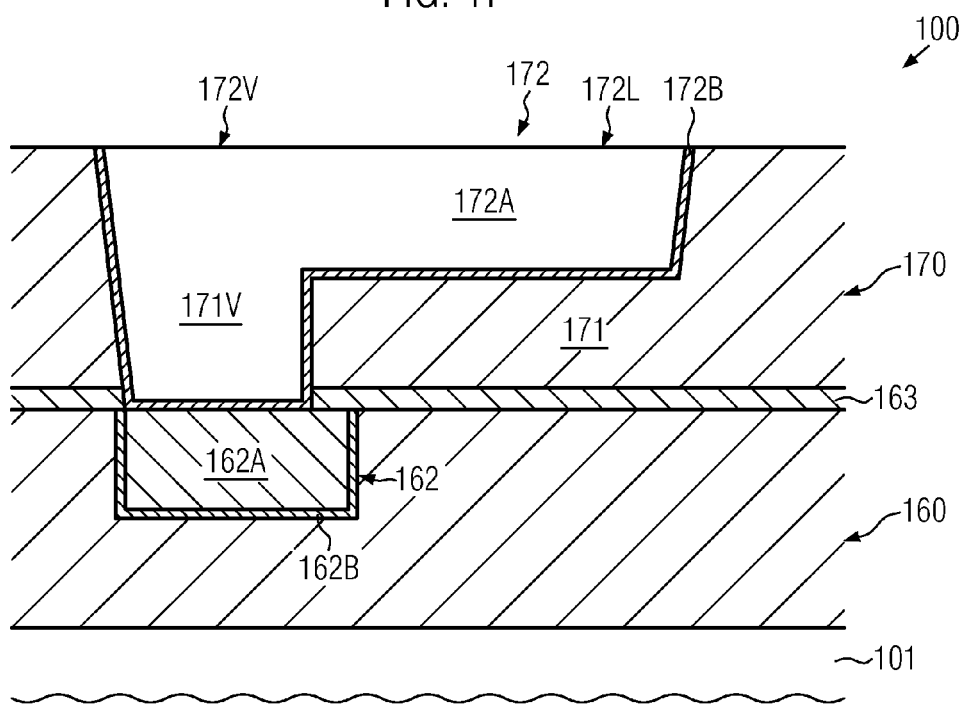
FIG. 1g schematically illustrates the semiconductor device in a further advanced manufacturing stage in which a copper-based interconnect structure may be formed so as to include a copper silicide barrier material, according to still further illustrative embodiments.

FIG. 1g schematically illustrates the semiconductor device 100 in a further advanced manufacturing stage. As shown, the interconnect structure 172 may comprise the copper/silicon barrier material 172B, which may be formed on the basis of any of the above-described process strategies, wherein, in some illustrative embodiments, the barrier layer 172B may comprise an additional layer or layer portion, such as a silicon layer portion as is, for example, shown in FIG. 1e, depending on the applied process strategy. In other cases, the copper/silicon compound may form an interface between the dielectric material 171 and a highly conductive core metal 172A, such as a copper material. Similarly, the conductive barrier layer 172B may also be provided as an interface between the metal region 162 and the interconnect structure 172, i.e., between a via 172V and the metal region 162. Since generally copper/silicon compound contained in a conductive barrier layer 172B may have an electrical conductivity and superior electromigration characteristics compared to conventional tantalum/tantalum nitride-based barrier materials, the electrical resistance between the metal region 162 and the interconnect structure 172 may be reduced, while nevertheless a current-induced material fusion through the interface formed by the barrier layer 172B may be reduced compared to conventional barrier systems. Similarly, any material extrusion from the metal line 172L into the dielectric material 171 may be suppressed due to the superior electromigration behavior. Consequently, for an otherwise given configuration of the metallization layers 160, 170, superior electrical performance and increased lifetime may be accomplished by providing the barrier layer 172B on the basis of a copper/silicon compound.

The semiconductor device 100 as illustrated in FIG. 1g may be formed on the basis of any appropriate process technique which may include the electrochemical deposition of the core metal by applying electroless deposition techniques, electroplating or any combination thereof. In some illustrative embodiments, the core metal 172A may be directly deposited on the conductive barrier material 172B and thus, in some illustrative embodiments, the metal 172A may be deposited directly on a copper/silicon compound. In other illustrative embodiments, a dedicated seed layer (not shown) may be formed, for instance by sputter deposition and the like, prior to filling in the core metal 172A. Thereafter, any excess material may be removed, for instance by chemical mechanical polishing (CMP), electro CMP, etching and the like, thereby also removing any residues of the conductive barrier material 172B. Thus, the interconnect structure 172 may be provided as an electrically isolated feature of the metallization layer 170. Thereafter, the further processing may be continued by forming a cap layer, such as a dielectric cap layer or a conductive cap layer on the interconnect feature 172. For example, a dielectric material, such as the material 163, may be formed so as to confine the core metal 172A, possibly in combination with a specific conductive cap material, which may be provided on the basis of electroless deposition techniques, if required. In some illustrative embodiments, also a copper/silicon compound may be formed at the surface of the interconnect structure 172 prior to depositing a dielectric material, which may be accomplished by applying similar process techniques, as are also discussed above with respect to the barrier layer 172B.

It should be appreciated that the metallization layer 160 may be formed on the basis of principles as disclosed above with respect to the metallization layer 170. In this case, also the barrier layer 162B may be provided so as to comprise a copper/silicon compound, thereby also imparting superior electromigration and electrical performance to the metal region 162.

As a result, the present disclosure provides manufacturing techniques and semiconductor devices in which a copper/silicon compound may be used as an efficient barrier material in complex metallization systems of semiconductor devices, thereby increasing the overall time to failure of the metallization system, while at the same time superior electrical performance may be obtained compared to conventional tantalum/tantalum nitride barrier systems.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a metallization system of a semiconductor device, the method comprising:
   forming an opening in a dielectric layer of a metallization layer of said metallization system, said opening exposing surface areas of said dielectric layer;
   forming a conductive barrier layer comprising a copper/silicon compound, said copper/silicon compound being positioned on and in contact with at least an entirety of said surface areas of said dielectric layer exposed by said opening; and
   forming a copper-containing metal on said conductive barrier layer.

2. The method of claim 1, wherein forming said opening comprises forming a trench and a via opening connected to said trench, wherein said via opening connects to a metal region formed in a second metallization layer formed below said metallization layer.

3. The method of claim 1, wherein forming said conductive barrier layer comprises forming a copper-containing layer above said exposed surface areas of said dielectric layer and treating said copper-containing layer in a silicon-containing process ambient.

4. The method of claim 3, wherein treating said copper-containing layer in a silicon-containing process ambient comprises establishing a gaseous ambient that contains silicon initiating diffusion of silicon species into said copper-containing layer.

5. The method of claim 4, wherein said gaseous ambient is established on the basis of a plasma.

6. The method of claim 3, wherein treating said copper-containing layer in a silicon-containing process ambient comprises forming a precursor layer on said copper-containing layer and initiating a decomposition of said precursor layer so as to initiate silicon diffusion into said copper-containing layer.

7. The method of claim 6, wherein said precursor layer is formed so as to comprise a carrier material based on at least one of triazol and a derivative of triazol, a silicon species being bonded to said carrier material.

8. The method of claim 3, wherein said copper-containing layer is formed on and in contact with at least said exposed surface areas of said dielectric layer.

9. The method of claim 3, wherein treating said copper-containing layer in a silicon-containing process ambient comprises forming a plurality of precursor layers on said copper-containing layer and, after forming each respective one of said plurality of precursor layers, initiating a decomposition of said respective precursor layer so as to initiate silicon diffusion into said copper-containing layer.

10. The method of claim 1, wherein forming said conductive barrier layer comprises forming a silicon-containing layer above said inner surface areas, forming a copper-containing layer on said silicon-containing layer and initiating silicon and copper interdiffusion.

11. The method of claim 10, wherein said silicon-containing layer is formed on and in contact with at least said exposed surface areas of said dielectric layer.

12. The method of claim 1, further comprising forming a copper-containing seed layer on said conductive barrier layer.

13. A method, comprising:
   forming an opening in a dielectric material of a metallization layer of a metallization system of a semiconductor device, said opening exposing surface areas of said dielectric material;
   forming a copper silicide barrier layer on and in contact with at least an entirety of said surface areas of said dielectric material exposed by said opening; and
   forming a copper-containing metal on said copper silicide barrier layer so as to fill said opening.

14. The method of claim 13, wherein forming said copper silicide barrier layer comprises depositing a copper layer and treating said copper layer in a silicon-containing process ambient.

15. The method of claim 14, wherein said silicon-containing process ambient is established as a plasma ambient.

16. The method of claim 13, wherein forming said copper silicide barrier layer comprises forming a silicon-containing layer on and in contact with at least said exposed surface of said dielectric material areas and forming a copper layer on said silicon-containing layer.

17. The method of claim 13, wherein forming said copper-containing metal on said copper silicide barrier layer comprises performing an electrochemical deposition process so as to directly deposit said copper-containing metal on said copper silicide barrier layer.

18. The method of claim 14, wherein said copper layer is formed on and in contact with at least said exposed surface areas of said dielectric material.

* * * * *